United States Patent [19]

Murray et al.

[11] Patent Number: 5,761,112
[45] Date of Patent: Jun. 2, 1998

[54] CHARGE STORAGE FOR SENSING OPERATIONS IN A DRAM

[75] Inventors: Michael A. Murray, Bellevue, Wash.; Lawrence C. Liu, San Jose; Li-Chun Li, Los Gatos, both of Calif.

[73] Assignee: Mosel Vitelic Corporation, San Jose, Calif.

[21] Appl. No.: 717,031

[22] Filed: Sep. 20, 1996

[51] Int. Cl.$^6$ ............................................. G11C 11/24
[52] U.S. Cl. .......................... 365/149; 365/207; 365/206
[58] Field of Search .............................. 365/149, 207, 365/206

[56] References Cited

U.S. PATENT DOCUMENTS 5,596,521  1/1997  Tanaka et al. ............................ 365/149

Primary Examiner—David C. Nelms
Assistant Examiner—Hoai V. Ho
Attorney, Agent, or Firm—Skjerven, Morrill, MacPherson, Franklin & Friel; Alan H. MacPherson; David T. Millers

[57] ABSTRACT

A DRAM has a sensing circuit which includes an on-chip capacitors having a total capacitance greater than about 35% of the total capacitance of the bit lines. The on-chip capacitors are coupled to a power line of the sense amplifiers and stabilizes a power supply voltage to prevent voltage drop and noise during the large sensing currents for a read/refresh cycle. A read/refresh cycle in accordance with an embodiment of the invention includes precharging bit lines and the on-chip capacitors before connecting memory transistors to the bit lines and connecting power to the sense amplifiers. Capacitors can be formed in any available space in the integrated circuit particularly in space under metal bus lines in peripheral circuitry surrounding a memory array.

11 Claims, 3 Drawing Sheets

_5,761,112_

CHARGE STORAGE FOR SENSING OPERATIONS IN A DRAM

BACKGROUND OF THE INVENTION

1. Field of the Invention

This invention relates to sensing memory cell states in a dynamic random access memory and particularly to processes and circuits for providing power to sense amplifiers.

2. Description of Related Art

During a read or refresh cycle of a conventional dynamic random access memory (DRAM), sense amplifiers in the DRAM pull up or down the voltages on the bit-lines connected to a row of memory cells being read or refreshed. Since the combined capacitance of the bit-lines and memory cells is large, a sensing current that charges and discharges the bit-lines is also large, and on-chip regulated voltage supplies are often unable to maintain the regulated voltage at the high sensing current. Even with a high-power or external power supply, impedance in the supply lines can cause the supply voltage to the sense amplifiers to drop during the high sensing current. The drops in the supply voltage create noise and slow charging of the sense amplifiers thereby increasing sensing time. A method to reduce the drop in supply voltage during sensing is sought.

SUMMARY OF THE INVENTION

In accordance with the invention, a dynamic random access memory includes one or more on-chip capacitors which are coupled to a power line used for sense amplifiers when reading or refreshing a row of memory cells. A power supply charges the on-chip capacitors between read/refresh cycles, and the capacitors and the power supply together provide a voltage to the sense amplifiers when charging bit lines and memory capacitors during a read/refresh cycle. The on-chip capacitors reduce the drop in supply voltage by supplying a larger portion of the charge required during sensing. Impedance between the on-chip capacitors and the sense amplifiers is small so that voltage drop between the on-chip capacitors and the sense amplifiers is also small.

In one embodiment, the on-chip capacitors provide a total capacitance which is greater than 35% of a total of the capacitances to be charged during read/refresh cycle lines which allows the capacitors to provide a significant fraction of the total charge in the sensing current during the read/refresh cycle. The on-chip capacitors are typically disposed among peripheral circuitry surrounding the array of memory cells and can be formed beneath buses (typically metal bus lines) in the peripheral circuitry. For example, on-chip capacitors may include an active region formed in a semiconductor substrate and a polysilicon region that overlies the active region and underlies metal bus lines. The on-chip capacitors do not increase chip area because areas under buses are often unusable for other purposes such as circuits that require interconnects that interfere with the bus lines.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an embodiment of the invention, an integrated dynamic random access memory (DRAM) includes one or more on-chip capacitors which supply a significant portion of the charge for currents generated during read/refresh cycles. The on-chip capacitors are connected to a supply voltage and allowed to charge during precharging of bit lines before a read/refresh operation. During sensing, the supply voltage and the on-chip capacitors supply charge to the bit-lines and connected memory capacitor. The on-chip capacitors reduce the voltage drop to the sense amplifiers during sensing by providing a large fraction of the currents required for sensing. In one embodiment, the on-chip capacitors have a total capacitance greater than about 35% of the capacitance of bit lines and memory cells charged during a read or refresh cycle. Additionally, the impedance between the sense amplifiers and the on-chip capacitors is small so that significant currents cause only small changes in the supplied voltage. The steadier supply voltage causes faster sensing with less noise.

On-chip capacitors are formed wherever layers of the integrated circuit are not required for other purposes and are typically dispersed among peripheral circuitry surrounding memory cell arrays. Capacitors can be formed, for example, using polysilicon regions and active regions underlying metal bus lines.

Accordingly, the relatively large capacitance required is provided without increasing circuit area.

Figure 1:
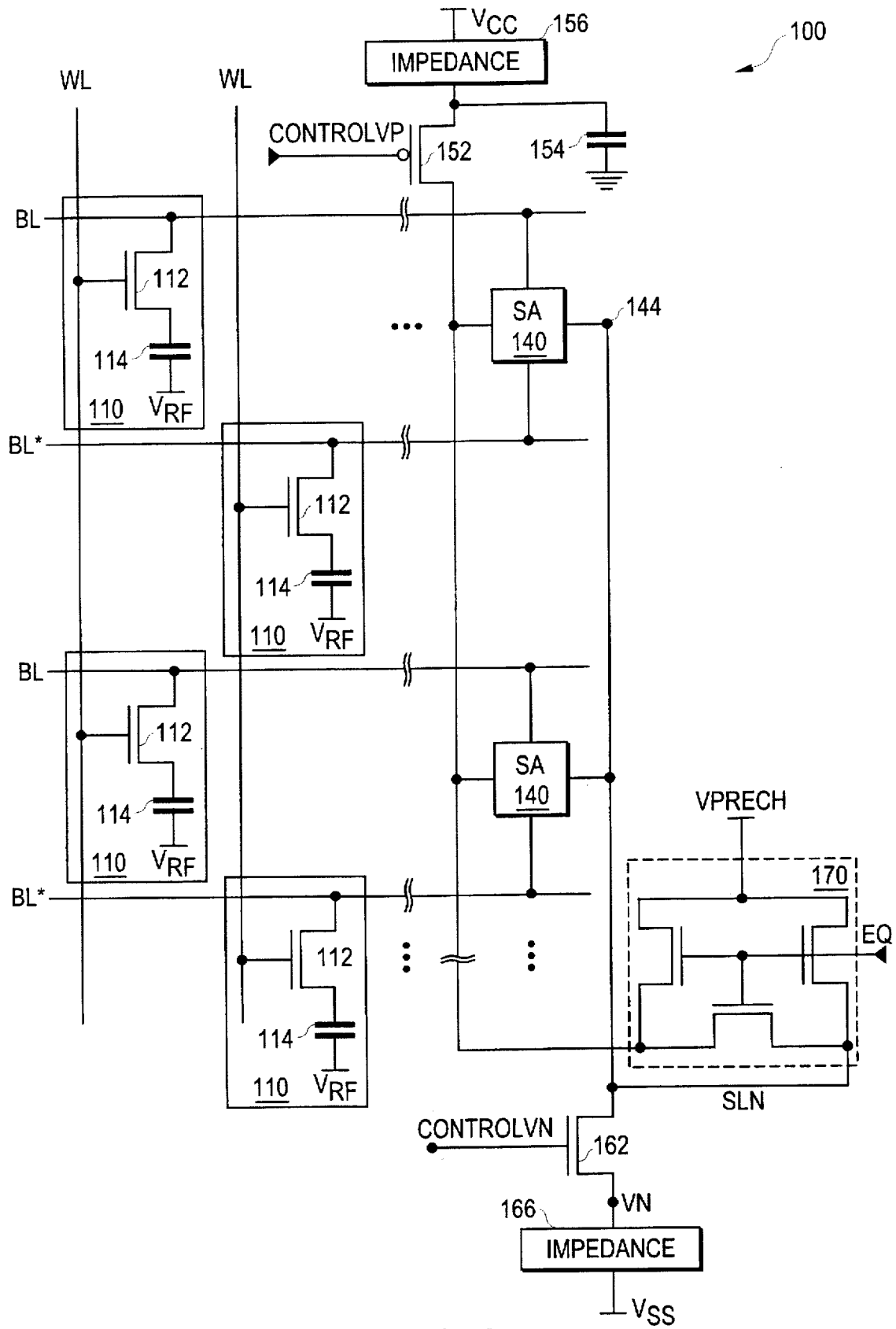
FIG. 1 shows a DRAM in accordance with an embodiment of the invention.

FIG. 1 shows a DRAM 100 in accordance with an embodiment of the invention. DRAM 100 includes an array of memory cells 110. Each memory cell 110 in the array includes a memory capacitor 114 and a pass transistor 112. Each pass transistor 112 has a drain connected to a bit line BL or BL* and a source connected to one plate of an associated memory capacitor 114. The other plate of each memory capacitor 114 is connected to a constant reference voltage VRF. In some embodiments, voltage VRF is about one half of a power supply voltage Vcc. In other embodiments, voltage VRF is ground.

Word lines WL extend along the rows of the array, and each word line WL couples to (or forms) the gates of pass transistors 112 in a row of memory cells associated with the word line. Bit lines BL and BL* extend along the columns of the memory array, and each pair of bit lines BL and BL* connects a sense amplifier 140 to a column of memory cells 110 associated with the pair of bit lines BL and BL*. In each column, the drains of every other of pass transistors 112 are coupled to bit lines BL, and the drains of the remaining pass transistors 112 are coupled to bit lines BL*. The gate of each pass transistor 112 in a column is coupled to a different word line WL.

Figure 2:
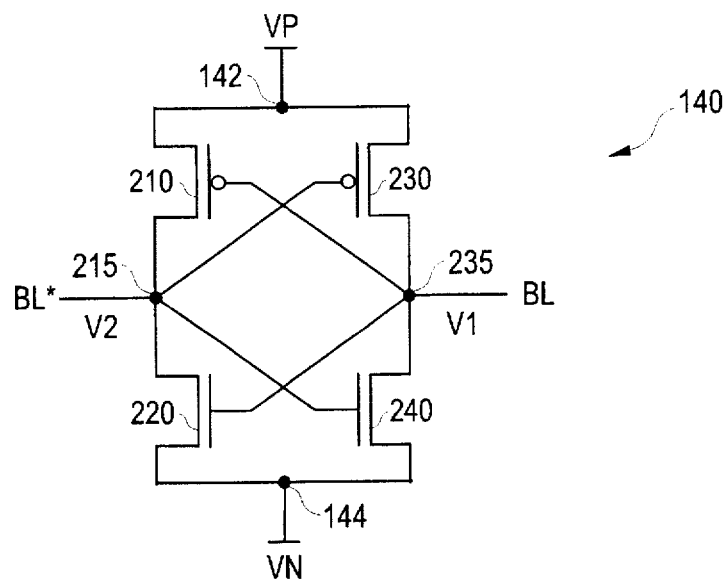
FIG. 2 shows a conventional sense amplifier usable in the DRAM of FIG. 1.

Each sense amplifier 140 has a first power input terminal coupled to a node 142 and a second power input terminal coupled to a node 144. Voltages on nodes 142 and 144 provide power for operating sense amplifiers 140. FIG. 2 shows a schematic of a conventional embodiment of sense amplifier 140. The embodiment shown includes a p-channel transistor 210 and an n-channel transistor 220 connected in series between nodes 142 and 144. Also connected in series between nodes 142 and 144 are a p-channel transistor 230 and an n-channel transistor 240. The gates of transistors 210 and 220 and the bit line BL associated with sense amplifier 140 are coupled to a node 235 between transistors 230 and 240. The gates of transistors 230 and 240 and the bit line BL* associated with sense amplifier 140 are coupled to a node 215 between transistors 210 and 220.

Referring again to FIG. 1, a control signal EQ applied to the gates of transistors in a precharge circuit 170 equalizes the voltages on nodes 142 and 144 at a voltage VPRECH which is about half of supply voltage Vcc. When control signal EQ is asserted, sense amplifiers 140 also equalize the voltages on bit lines BL and BL* to about voltage VPRECH. A signal CONTROLVP applied to the gate of a p-channel transistor 152 between node 142 and voltage Vcc controls whether voltage VP is applied to node 142 through transistor 152. Supply voltage Vcc may be from an external power supply or internal voltage regulator. U.S. patent application Ser. No. 08/695,058, entitled "Methods and Apparatus for Charging a Sense Amplifier", filed Aug. 9, 1996, which is hereby incorporated by reference in its entirety, describes a DRAM where an external higher-voltage power supply initially supplies a higher voltage EVCC to begin charging bit-lines and later switches to a lower voltage IVCC. A signal CONTROLVN applied to the gate of an n-channel transistor 162 between node 144 and reference voltage Vss (or ground) controls whether node 144 is grounded through transistor 162. When the voltage difference between nodes 142 and 144 is sufficiently high, each sense amplifier 140 pulls the higher of voltages V1 and V2 on bit lines BL and BL* up and pulls the lower of voltages V1 and V2 down.

Figure 3:
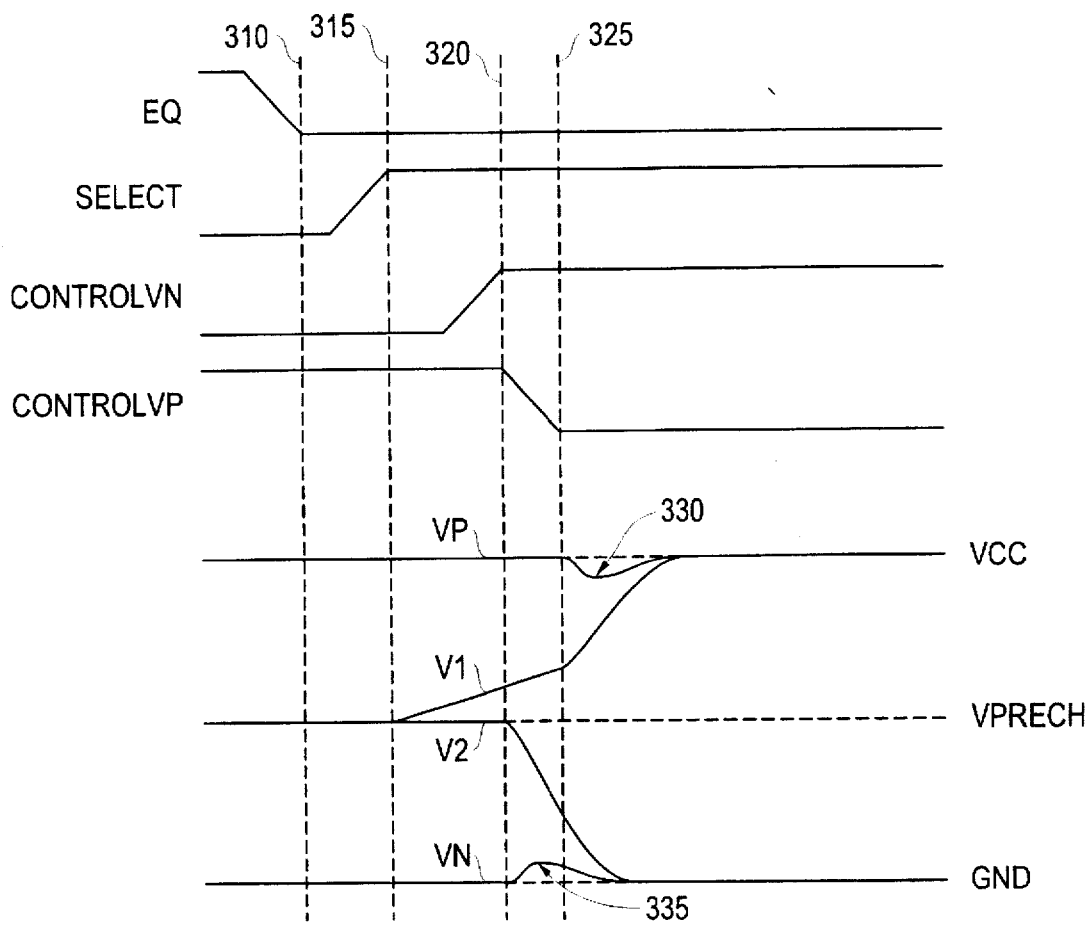
FIG. 3 shows timing diagrams for signals in the DRAM of FIG. 1.

FIG. 3 shows timing diagrams for control signals during a read/refresh operation for DRAM 100. Before a read/refresh operation, control signal EQ is asserted which equalizes the voltages on nodes 142 and 144. Sense amplifiers 140 and/or precharge circuitry (not show) also charge bit lines BL and BL* to voltage VPRECH. One or more on-chip capacitors 154 charge up to voltage Vcc while bit lines BL and BL* precharge. At a time 310, signal EQ is deasserted which turns off precharge circuit 170 in preparation for asserting a control signal SELECT to a selected one of word lines WL at time 315. Signal SELECT turns on pass transistors 112 for a row of memory cells 110 which connects associated memory capacitors 114 to bit lines BL or BL*. Each sense amplifier 140 is coupled to exactly one memory capacitor 114 through bit lines BL or BL*. Memory capacitors 114 pull voltages on the connected bit lines BL or BL* up or down slightly depending on the voltages previously stored in the capacitors 114. FIG. 3 shows an example where a memory capacitor 114 is coupled to bit line BL and has a voltage higher than voltage VPRECH on bit line BL so that the capacitor 114 pulls the voltage V1 to a level higher than voltage V2 on bit line BL*. Other possibilities, such as the selected row of memory cells being connected to bit lines BL* and/or a memory capacitor 114 storing a voltage level below voltage VPRECH, develop voltages similar to those of FIG. 3.

Signals CONTROLVN and CONTROLVP are respectively asserted at times 320 and 325 to begin amplification by sense amplifiers 140. Supply voltage Vcc and capacitor 154 source a sensing current through sense amplifiers 140 to the higher voltage bit line BL or BL* connected to each sense amplifier 140, and reference voltage Vss sinks current from the lower voltage bit line BL* or BL. The resulting voltage VP applied to node 142 falls below voltage Vcc as the current is drawn through an impedance 156 of structures which connect voltage supply Vcc to node 142. On-chip capacitors 154 supply charge for the sensing current through sense amplifiers 140 and help maintain voltage VP nearer voltage Vcc. Capacitors 154 are also coupled to the substrate in which memory 100 is formed and help prevent noise in reference voltage Vss and voltage VN.

Figure 4:
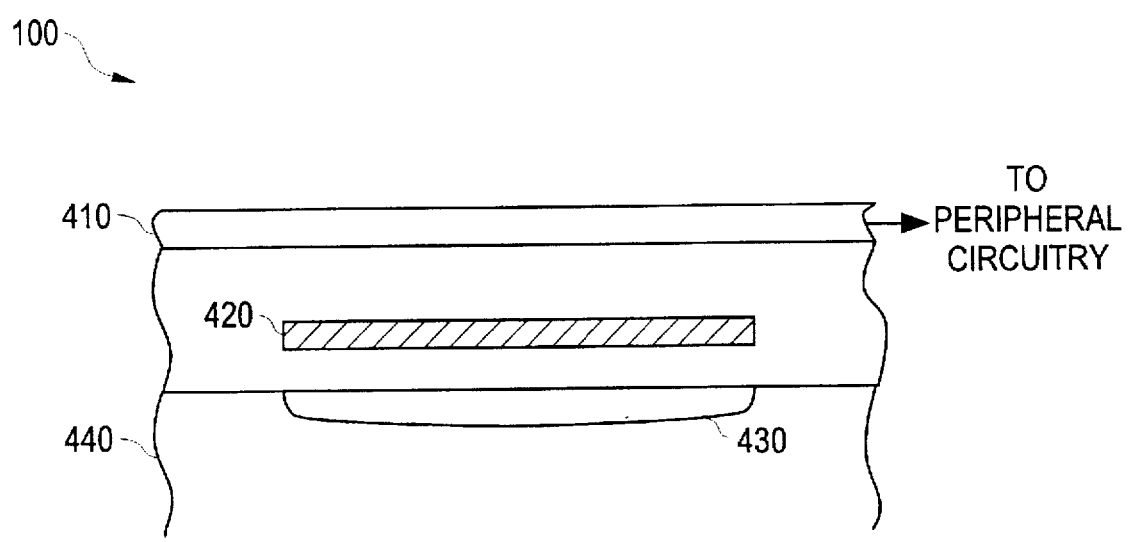
FIG. 4 shows a different placement of capacitors in the DRAM of FIG. 1 in accordance with another embodiment of the invention.

Capacitors 154 are formed on-chip to avoid impedance created by bonding wires. If desired, capacitors 154 can be distributed where space is available within an integrated circuit. For example, a typical DRAM integrated circuit includes an array of memory cells which is surrounded by peripheral circuitry such as decode, control, and interface circuits, and on-chip capacitors 154 can be interspersed among the peripheral circuitry. Additionally, as shown in FIG. 4, DRAMs 100 commonly employ metal lines 410 for address, data, and control buses which connect the peripheral circuitry. Capacitors 154 can be formed beneath the buses, for example, using active regions 430 in a substrate 440 and overlying conducting regions 420 (typically regions of a polysilicon gate layer) which are between substrate 440 and the metal bus lines 410. The capacitors thus occupy space which could not be occupied by complicated circuits which require interconnects in (or other use of) the layer which forms the buses.

Although the invention has been described with reference to particular embodiments, the description is only an example of the invention's application and should not be taken as a limitation. Various other adaptations and combinations of features of the embodiments disclosed are within the scope of the invention as defined by the following claims.

We claim:

1. An integrated dynamic random access memory comprising:

an array of memory cells;

a plurality of bit lines, wherein each bit line couples to memory cells in a column associated with the bit line;

a plurality of sense amplifiers coupled to the bit lines;

a power line coupled to provide power to the sense amplifiers;

one or more on-chip capacitors which are coupled to the power line; and a transistor coupled between the sense amplifiers and the on-chip capacitors.

2. The integrated circuit of claim 1, wherein the on-chip capacitors provides a total capacitance which is greater than 35% of a total capacitance of the bit lines.

3. The integrated circuit of claim 1, wherein the on-chip capacitors are disposed among peripheral circuitry surrounding the array of memory cells.

4. The integrated circuit of claim 3, wherein the on-chip capacitors comprises a first capacitor formed beneath a bus in the peripheral circuitry.

5. The integrated circuit of claim 4, wherein the first capacitor comprises an active region formed in a semiconductor substrate and a conductive region overlying the active region, and wherein the bus comprises lines overlying the conductive region.

6. A method for reading/refreshing a row of memory capacitors in an integrated circuit, comprising:

charging a first capacitor within the integrated circuit;

connecting the row of memory capacitors to bit lines, wherein a first set of memory capacitors in the row changes voltages on a first set of bit lines; and connecting the first capacitor and a supply voltage to a plurality of sense amplifiers which are coupled to the bit lines, wherein the first capacitor and the supply voltage provide currents through the sense amplifiers which charge the first set of bit lines and the first set of memory capacitors.

7. The method of claim 6, wherein the first capacitor has a capacitance which is greater than 35% of a total capacitance of the bit lines.

8. The integrated circuit of claim 1, wherein the capacitors supply charge to the bit lines and the sense amplifiers during read/refresh operations.

9. The integrated circuit of claim 8, wherein the capacitors are charged before the read/refresh operations.

10. The integrated circuit of claim 1, wherein a control signal to the transistor determines when power is provided to the sense amplifiers.

11. The method of claim 6, wherein the step of charging a first capacitor is performed, followed by the step of connecting the row of memory capacitors, followed by the step of connecting the first capacitor and a supply voltage.

* * * * *